United States Patent
Coons et al.

(10) Patent No.: US 12,061,230 B2
(45) Date of Patent: Aug. 13, 2024

(54) ACTIVE OPTICAL PLUG TO OPTICALLY OR ELECTRICALLY TEST A PHOTONICS PACKAGE

(71) Applicant: Intel Corporation, Santa Clara, CA (US)

(72) Inventors: Todd R. Coons, Gilbert, AZ (US); Michael Rutigliano, Chandler, AZ (US); Joe F. Walczyk, Tigard, OR (US); Abram M. Detofsky, Tigard, OR (US)

(73) Assignee: Intel Corporation, Santa Clara, CA (US)

( * ) Notice: Subject to any disclaimer, the term of this patent is extended or adjusted under 35 U.S.C. 154(b) by 719 days.

(21) Appl. No.: 17/131,604

(22) Filed: Dec. 22, 2020

(65) Prior Publication Data

US 2022/0196732 A1  Jun. 23, 2022

(51) Int. Cl.
*G01R 31/308* (2006.01)
*G02B 6/42* (2006.01)

(52) U.S. Cl.
CPC ......... *G01R 31/308* (2013.01); *G02B 6/4256* (2013.01); *G02B 6/4292* (2013.01)

(58) Field of Classification Search
CPC .................................................. G01R 31/308
USPC .................................................. 324/754.32
See application file for complete search history.

(56) References Cited

U.S. PATENT DOCUMENTS

| 2009/0180734 A1 | 7/2009 | Fiorentino |
| 2017/0082799 A1* | 3/2017 | Novack ............... G01R 31/308 |
| 2019/0094460 A1 | 3/2019 | Brusberg |
| 2020/0232878 A1* | 7/2020 | Ma ....................... G01M 11/331 |

FOREIGN PATENT DOCUMENTS

EP  3945328  2/2022

OTHER PUBLICATIONS

Search Report from European Patent Application No. 21196266.7, mailed Mar. 15, 2022, 13 pgs.
Zimmermann L et al: "g-Pack—a generic testbed package for Silicon photonics devices", Group IV Photonics, 2008 5th IEEE International Conference on, IEEE, Piscataway, NJ, USA, Sep. 17, 2008 (Sep. 17, 2008), pp. 371-373, XP031344533, ISBN: 978-1-4244-1769-8.

* cited by examiner

*Primary Examiner* — Vincent Q Nguyen
(74) *Attorney, Agent, or Firm* — Schwabe, Williamson & Wyatt, P.C.

(57) ABSTRACT

Embodiments described herein may be related to apparatuses, processes, and techniques related to active optical plugs used to cover optical connectors of a photonics package to protect the connectors. The active optical plugs may also be used to perform testing of the photonics package, including generating light to be sent to the photonics package and to detect light received from the photonics package as part of the test protocol. This allows testing the optical connection and the photonics package, without exposing the optical connections of the package to damage from dust or physical contact. Other embodiments may be described and/or claimed.

20 Claims, 8 Drawing Sheets

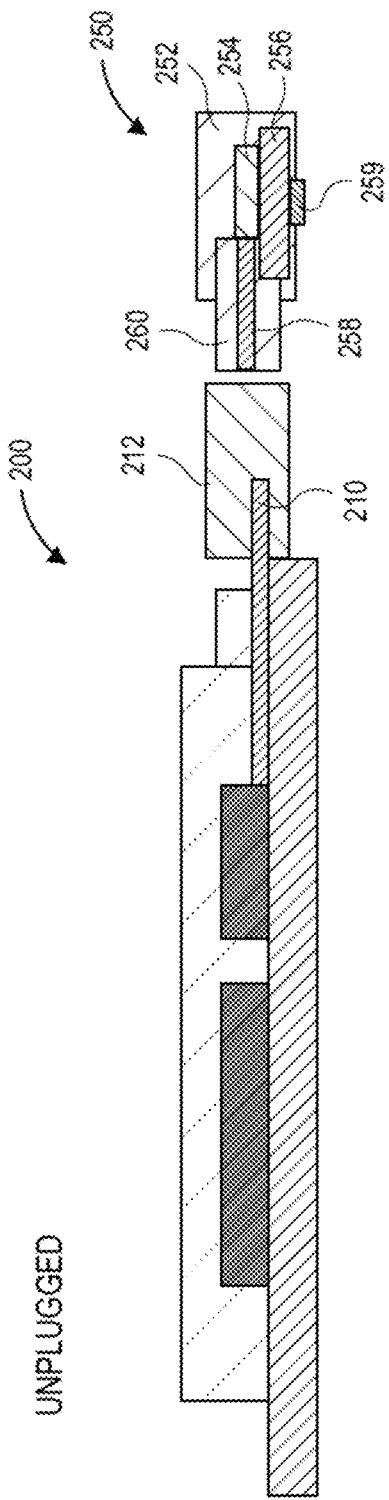
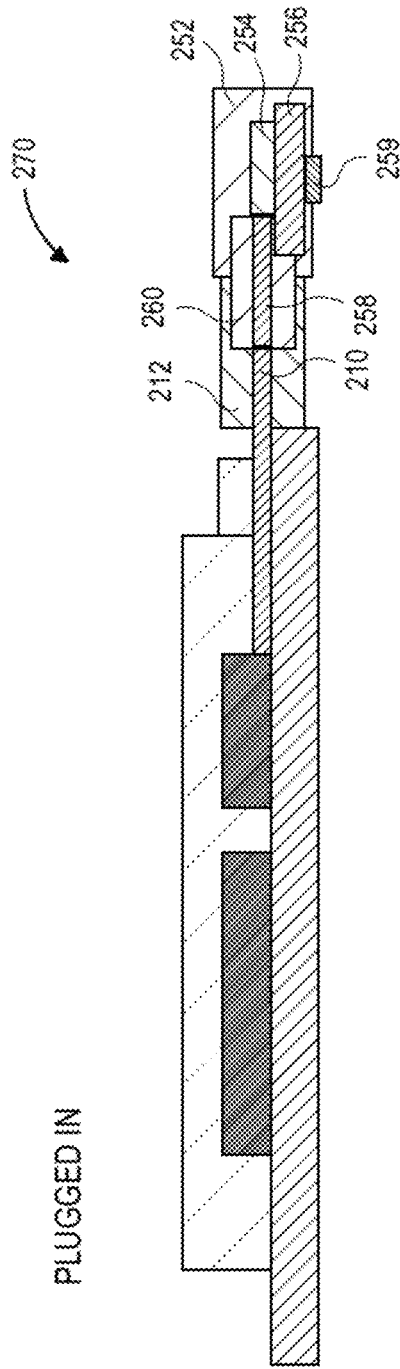

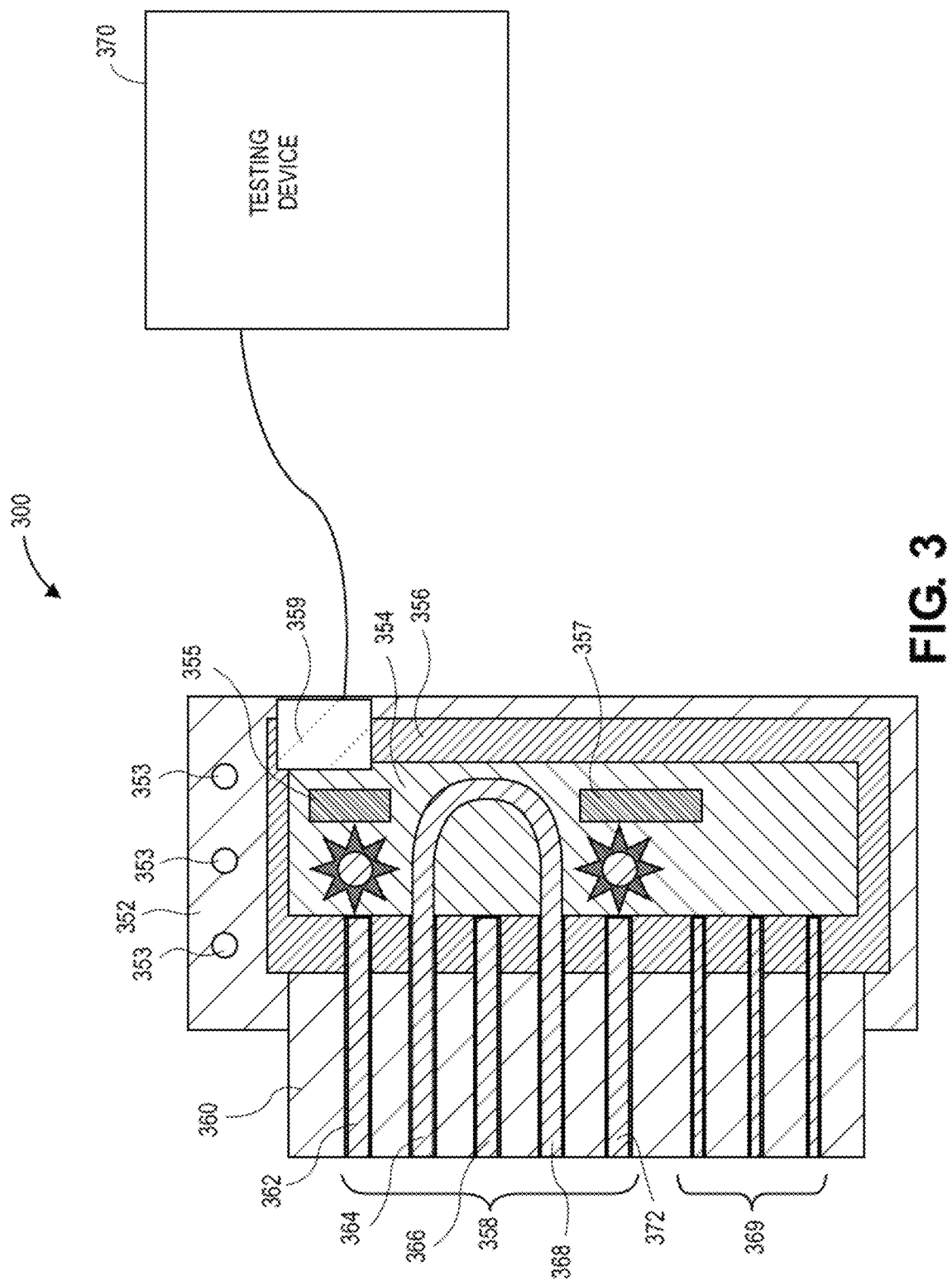

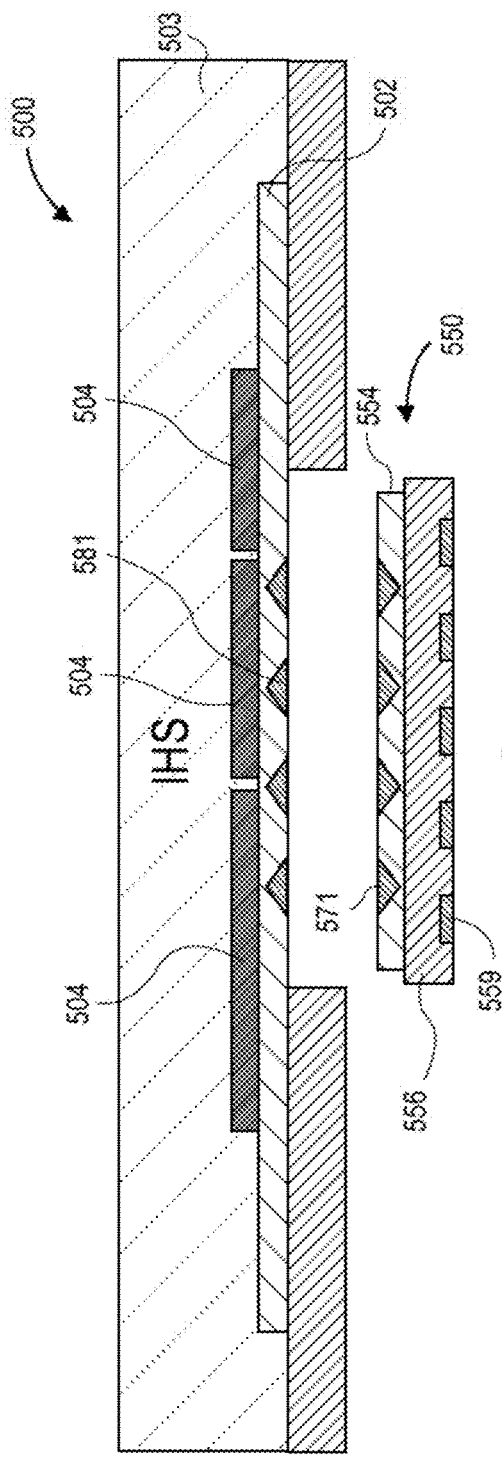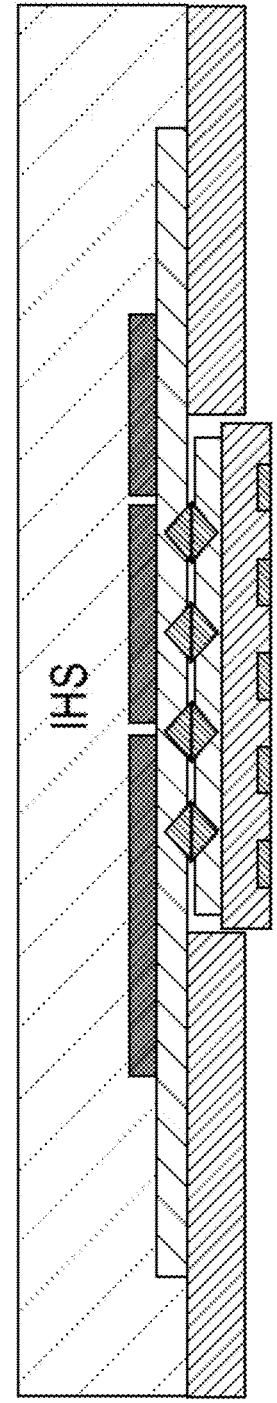
FIG. 5A
FIG. 5B

ACTIVE OPTICAL PLUG TO OPTICALLY OR ELECTRICALLY TEST A PHOTONICS PACKAGE

FIELD

Embodiments of the present disclosure generally relate to the field of semiconductor packaging, and in particular to testing photonics packages.

BACKGROUND

Continued growth in virtual machines and cloud computing will continue to increase the demand for high-quality optical receiver and transmitter devices.

BRIEF DESCRIPTION OF THE DRAWINGS

FIGS. 2A-2B illustrate example side views of two block diagrams of an integrated photonics package with a photonics connector and an active optical plug that is unplugged and plugged into the photonics connector, in accordance with various embodiments.

FIG. 3 illustrates an example top-down detailed block diagram of components of an active optical plug, in accordance with various embodiments.

FIGS. 5A-5B illustrate example side views of two block diagrams of an integrated photonics package with a photonics connector and an active optical plug that is uncoupled and coupled with a photonics package, in accordance with various embodiments.

DETAILED DESCRIPTION

Figure 1:
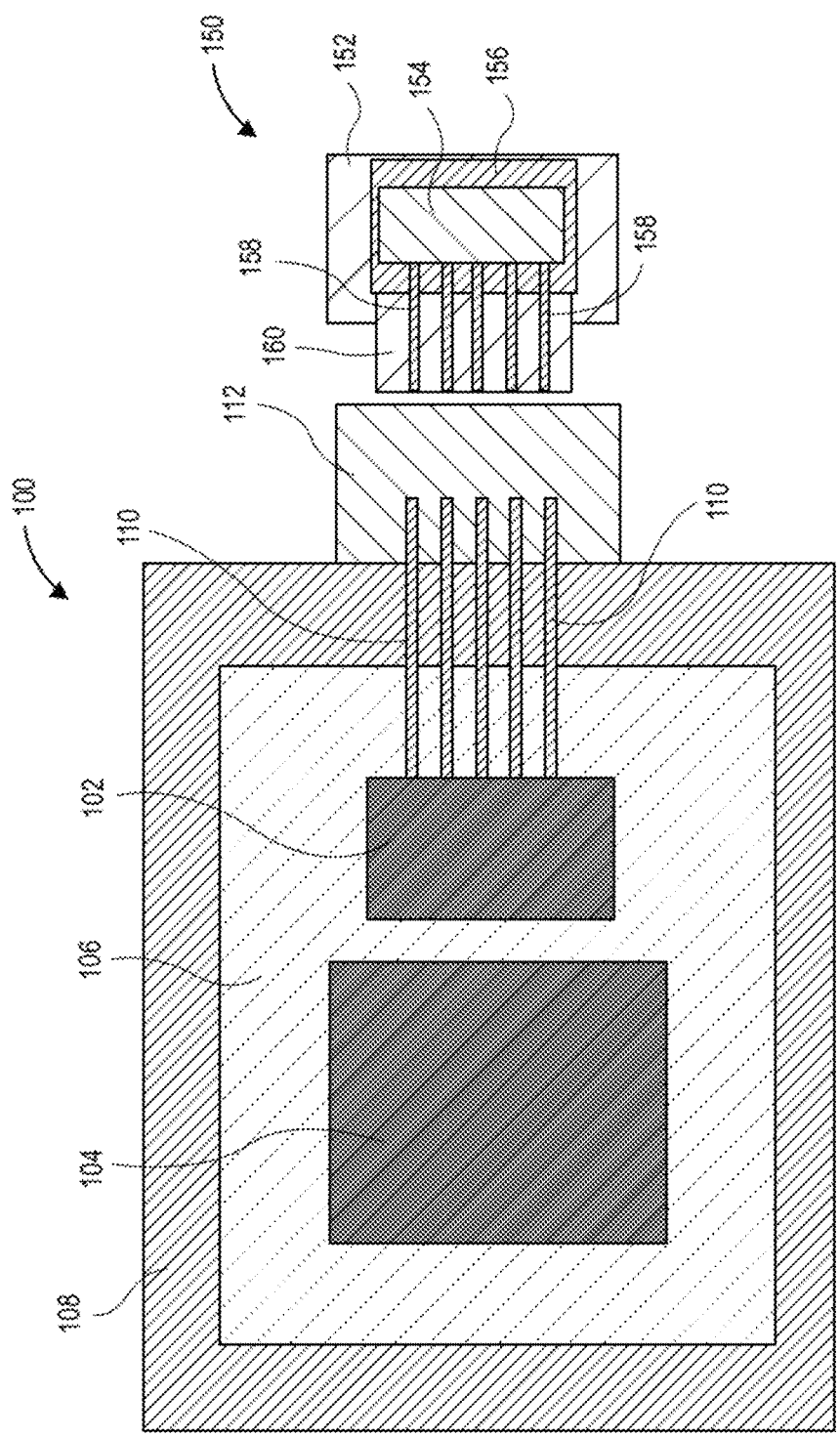
FIG. 1 illustrates an example top-down block diagram of an integrated photonics package with a photonics connector and an active optical plug to be inserted into the photonics connector, in accordance with various embodiments.

Embodiments described herein may be related to apparatuses, processes, and techniques related to active optical plugs, which may also be referred to as "smart optical plugs," that may be used to cover optical connectors of photonics packages. In embodiments, these active optical plugs may be used to protect the optical connectors, which may be referred to as optical interconnects, of a photonics package that may be very sensitive to damage due to dust, debris, or physical contact.

In embodiments, these active optical plugs may also be used to perform testing of the photonics package, including generating light to be sent to the photonics package as part of the test protocol, receiving light from the photonics package, and/or sending or receiving electrical signals to the photonics package. In embodiments, the active optical plugs may also receive or transmit optical signals outside the photonics package. This functionality allows testing the optical connection of the photonics package, as well as the optical and/or electrical functioning of the photonics package, without exposing the optical connections of the package to damage from dust or physical contact.

In embodiments, the active optical plugs may include a photonics chip that may detect light from one or more optical pathways in the optical connector of the photonics package. In embodiments, the photonics chip may also be used to generate light to be transmitted down the one or more optical pathways in the optical connector. In embodiments, the active optical plugs may also electrically couple with electrical connectors within the optical connector of the photonics package to facilitate testing of optical-electrical components of the photonics package. In embodiments, the optical connectors may include one or more optical fibers that may be shielded by a housing.

In embodiments, the active optical plug may also include electrical and/or optical connectors between the photonics chip and another device different from the photonics package. In embodiments, the other device may be used to download or to program testing instructions into the active optical plug that may be used to step through one or more testing sequence of the photonics package. In embodiments, the result of the operational test of the photonics package may be stored within the photonics package, may be stored within the photonics chip of the active optical plug, or may be transferred to the other device.

In embodiments, the result of the operational test may be displayed through a series of lights, sounds, or other displays that are part of active optical plug and may be detectable by looking at or listening to the active optical plug. In embodiments, the result of the operational test may be communicated to the other device to which the active optical plug is electrically and/or optically coupled. This other device may then communicate the status of the test to other systems or to one or more people in within a manufacturing or testing environment. In embodiments, the active optical plug may be powered through an external source, powered by an electrical connection with the photonics package, or may be powered by a battery or some other electrical storage device within the active optical plug.

Legacy implementations of optical plugs include passive loopback connectors that are used to route an optical output signal from one fiber of a photonics package and loop it back into another optical input fiber of the photonics package. These legacy implementations are insufficient to fully test optical and/or electrical features in the photonics package. In addition, repeated testing of an optical fiber connector, for example continually plugging in and unplugging testing devices into the optical connector of the photonics device may lead to increased foreign material and damage to the fiber connectors.

In embodiments, the active optical plug may simplify the cost and complexity of testing photonics dies, photonics chips, or packages that include photonics modules. In embodiments, the photonics modules may be silicon photonic modules. The active optical plug may use native digital and power inputs to provide optical signals needed to test the photonics module. The active optical plug may be positioned in the photonics package throughout the testing process. In embodiments, testing of the photonics package may be performed during transit of the package to the customer using the active optical plug. When the customer receives the photonics package and active optical plug, the customer may perform additional testing using the active optical plug prior to removing the plug and connecting the photonics package with the customers end solution.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

FIG. 1 illustrates an example top-down block diagram of an integrated photonics package (IPP) with a photonics connector and an active optical plug to be inserted into the photonics connector, in accordance with various embodiments. IPP 100 may include a photonics integrated circuit (PIC) 102 that may be coupled with a system on chip (SOC) 104. Both the PIC 102 and the SOC 104 may be electrically coupled using interconnect 106. Interconnect 106 may include, an interconnect bridge, such as an embedded multi-die interconnect bridge (EMIB), or a silicon interposer, organic routing on substrate 108 or a redistribution layer (RDL) substrate 108, or some other electrical coupling. In embodiments, the electrical coupling may be a high density electrical coupling.

In embodiments, the SOC 104 may include a central processing unit (CPU), graphics processing unit (GPU), field programmable gate array (FPGA), application specific integrated circuit (ASIC), accelerator, or some other processing device. In embodiments, the SOC 104 may be referred to as an XPU.

Multiple optical pathways 110 may optically couple the PIC 102 with a photonics connector 112. In embodiments, the optical pathways 110 may be implemented as optical waveguides, as optical fibers, or as a lens. In embodiments, the optical pathways 110 may extend partially into the photonics connector 112. In embodiments, the photonics connector 112 may be physically and/or rigidly coupled with the substrate 108. In embodiments, the photonics connector 112 may be physically and/or rigidly coupled with some other structure (not shown) that may be part of the IPP 100.

The photonics connector 112 may be a socket-type female connector. The photonics connector 112 may be made of a plastic, a dielectric, or some other suitable material able to support the optical pathways 110, for example to support optical fibers for face coupling. The optical pathways 110 may and within the photonics connector 112. In embodiments, the optical pathways 110 may be parallel and in a plane, may be staggered into multiple rows, or may be in some other configuration to provide a clean optical connection when an active optical plug 150 is inserted into the photonics connector 112.

The active optical plug 150 includes a housing 152 that may include a photonics chip 154 that may be coupled to a substrate 156. There are multiple optical fibers 158 that are optically coupled with the photonics chip 154, and extend into a support material 160 that is used to support and align the optical fibers 158. The support material 160 may be physically coupled with the housing 152 and/or the photonics chip 154.

The support material 160 may insert into the photonics connector 112 socket to facilitate a robust connection with low transmission loss between the optical fibers 158 and the optical pathways 110. In embodiments, the support material 160 may be a male connector that plugs into a female socket of the photonics connector 112. In embodiments, the support material 160 may have a certain geometry and dimensions to allow proper alignment of the optical pathways 110 and optical fibers 158 when inserted into the photonics connector 112. In embodiments, the support material 160 and/or the housing 152 may include ferrules (not shown) to help align and/or secure the connection of the support material 160 into the photonics connector 112. In embodiments, there may be latches and/or locking mechanisms (not shown) to secure the active optical plug 150 into the photonics connector 112.

FIGS. 2A-2B illustrate example side views of two block diagrams of an integrated photonics package with a photonics connector and an active optical plug that is unplugged and plugged into the photonics connector, in accordance with various embodiments. FIG. 2A shows a side view of FIG. 1. IPP 200, which may be similar to IPP 100 of FIG. 1, includes a photonics connector 212, which may be similar to photonics connector 112, and includes optical pathways 210, which may be similar to optical pathways 110, that are partially embedded within the photonics connector 212. As shown from this side view, there is a single row of one or more optical pathways 210, which may be optical fibers.

Active optical plug 250, which may be similar to active optical plug 150 of FIG. 1, includes a housing 252, photonics chip 254, and a substrate 256, which may be similar, respectively, to housing 152, photonics chip 154, and substrate 156 of FIG. 1. Optical fibers 258, which may be similar to optical fibers 158 of FIG. 1, may optically couple with the photonics chip 254 when inserted into photonics connector 212, by extending through the support material 260, which may be similar to support material 160 of FIG. 1. In embodiments, optical fibers 258 may be implemented as waveguides, or as some other optical pathway.

As shown, the support material 260 that includes optical fibers 258 is ready to slide into the photonics connector 212, which, as shown, is implemented as a socket. Both the support material 260, housing 252, and photonics connector 212 are designed in so that when inserted, the fibers 258 align with and cleanly optically couple with the optical pathways 210. In addition, pad 259 may be electrically coupled with the photonics chip 254 and may be used to provide electrical power or electrical signals between the photonics chip 254 and an outside device such as device 370 of FIG. 3 as described below.

FIG. 2B shows active optically plugged package 270 where the IPP 200 is securely coupled with the active optical plug 250, the support material 260 fully inserted into the photonics connector 212 to form a clean optical coupling between optical pathway 210 and optical fiber 258. In embodiments, the housing 252 may be adjacent to the photonics connector 212. In embodiments, there may be a coupling mechanism (not shown) or a ferrule (not shown) to secure the active optical plug 250 to the photonics connector 212. Once inserted, the active optical plug 252 will protect optical pathways 210 from dust and/or damage that may result in debris or other material entering the photonics connector 212.

The active optically plugged package 270, in embodiments, may be electrically coupled using electrical pad 259 with another device, such as device 370 of FIG. 3. In embodiments, the active optically plugged package 270 may be placed onto another testing platform, for example by placing the active optically plugged package 270 onto another testing device (not shown) to upload test processes and/or procedures into the photonics chip 254 for later electro-optical testing of the IPP 200. In embodiments, the other testing device (not shown) may be used to directly perform tests (through, for example, an electrical connection with photonics chip 254) on the IPP 200.

FIG. 3 illustrates an example top-down detailed block diagram of components of an active optical plug, in accordance with various embodiments. Active optical plug 300 may be similar to active optical plug 150 of FIG. 1. Active optical plug 300 may include a housing 352, a photonics chip 354, a substrate 356, support material 360, and optical fibers 358, which may be similar to, respectively, active optical plug 100, housing 152, photonics chip 154, substrate 156, support material 160, and optical fibers 158 of FIG. 1.

In embodiments, the photonics chip 354 may perform a number of active test functions, when plugged in, to the IPP, such as IPP 100. For example, the photonics chip 354 may generate light signals for transmission down optical fiber 362, 372, and to detect various light signals from optical fiber 366. This generation of light signals may include generating predefined or random optical signal patterns to test the IPP. In addition, the active optical plug 300 may include a traditional optical loopback function as shown with respect to optical fibers 364, 368 so that the IPP can self-test. In embodiments, the photonics chip 354 may go beyond simple loopback and introduce or inject optical impairment, attenuation, or other optical signal disturbances within the optical loopback.

In embodiments, the photonics chip 354 may also include a battery 355, or other energy storage source, that may be used to provide electrical power to the active optical plug 300 during testing operation. In addition, the photonics chip 354 may include processor circuitry and/or memory 357 that may be used to store instructions for performing one or more testing sequences. In addition, the processor circuitry and/or memory 357 may be used to store results of tests for later upload. In embodiments, the processor circuitry may be implemented as, for example, a CPU, a field programmable gate array (FPGA), or an application-specific integrated circuit (ASIC).

In embodiments, the active optical plug 300 may include an electrical interface 359 that may be used to electrically couple the photonics chip 354 with another device, such as device 370. In embodiments, the electrical interface 359 may be a micro USB, a USB C port, or other electrical port that may carry power and/or data. In embodiments, the electrical interface 359 may be used to charge the battery 355, may be used to power operation of the photonics chip 354, or may be used to read IPP 100 test data results from the memory 357.

In other embodiments, the electrical interface 359 may be used to download test sequence instructions into the memory 357. In embodiments where portions of the processor circuitry and/or memory 357 is implemented using a FPGA, the electrical interface 359 may be used to program the FPGA with various test sequence instructions. In embodiments, the pad 259 of FIGS. 2A-2B (on the underneath side of active optical plug 300 with respect to the perspective shown in FIG. 3) may serve an electrical connection function that is similar to electrical interface 359.

In embodiments, one or more lights 353 coupled with the housing 352 may be used to signal various states of a testing process being performed by active optical plug 300. In embodiments, these lights may be different colors or may be able to change color, may be a flashing light or may be an occult light. In embodiments, these lights may display symbols such as letters or numbers (not shown). In embodiments, various states of the testing process may be indicated by audible signals such as beeps, sequences of beeps, or different tones (not shown).

In embodiments, there may be one or more electrical paths 369 that electrically couple with the photonics chip 354 to allow electrical signals to pass back and forth between the active optical plug 300 and the IPP 100. These electrical paths 369 may communicate data and/or provide power to the IPP 100, and may be used by the photonics chip 354 to identify initiate testing sequences in, or identify testing states of the IPP 100.

In embodiments, there may be a testing device 370 that may be electrically coupled with the active optical plug 300. This electrical connection may be made through the electrical port 359, or through the pad 259 of FIGS. 2A-2B. In embodiments, the electrical connection may be made by placing the optically plugged package 270 onto a connector mechanism (not shown) that is electrically coupled to the testing device 370. In embodiments, the electrical port 359 or the pad 259 may provide customers with access to features to debug or verify that the photonics connector 212 and the IPP 200 are functioning properly. In embodiments, there may be an optical connection between the photonics chip 354 and the testing device 370.

Figure 4:
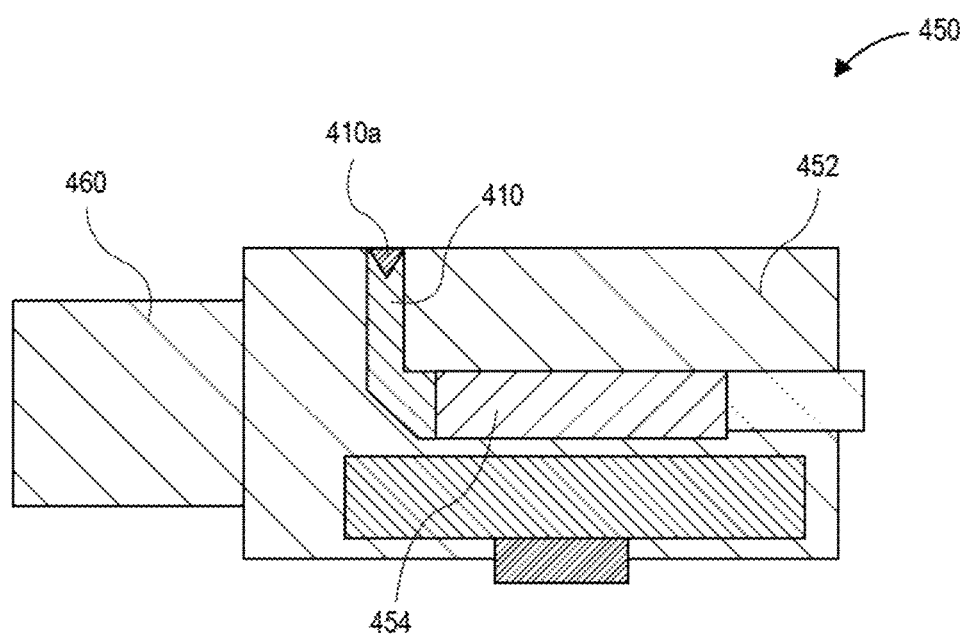
FIG. 4 illustrates an example side view diagram of an active optical plug with optical connectors on a top of the active optical plug, in accordance with various embodiments.

FIG. 4 illustrates an example side view diagram of an active optical plug with optical connectors on a top of the active optical plug, in accordance with various embodiments. Active optical plug 450 may be similar to active optical plug 300 of FIG. 3, 250 of FIG. 2A, or 150 of FIG. 1. However, active optical plug 450 has a light path 410 that extends upward through the housing 452 to couple with an IPP (not shown), which may be similar to IPP 100 of FIG. 1, that receives light from a top or a bottom of the photonics die 102 of FIG. 1.

In embodiments, a lens 410a may be embedded in the housing 452 and within the optical path 410 to allow optical coupling with the photonics die. In embodiments, the photonics chip 454 may be optically coupled with the light path 410 using a grating coupler (not shown) or some other optical device to bend light in a 90° direction relative from an edge of the photonics chip 454. In other embodiments, the direction of the light path may be varied in order to provide a clean, low loss optical coupling with the IPP (not shown). In embodiments, the support material 460, which may be similar to support material 360 of FIG. 3, may be used as needed to secure the active optical plug 450 into the IPP (not shown). Embodiments of active optical plug 450 may be used with respect to FIGS. 5A-5B below.

FIGS. 5A-5B illustrate example side views of two block diagrams of an integrated photonics package with a photonics connector and an active optical plug that is uncoupled and coupled with an integrated photonics package, in accordance with various embodiments. IPP 500, which may be similar to IPP 200 of FIG. 2A, shows a configuration where an active optical plug 550 is aligned and in position to be coupled with the IPP 500.

The active optical plug 550 may include a substrate 556 with pads 559 coupled to one side of the substrate 556 and the photonics chip 554 coupled with the other side of the substrate 556. The substrate 556, photonics chip 554, and pads 559 may be similar to substrate 356 and photonics chip 354 of FIG. 3, and pads 559 may be similar to pads 259 of FIGS. 2A-2B. As shown, the photonics chip 554 may include multiple lenses 571 that may be similar to the fibers 358 of FIG. 3. These multiple lenses 571 may optically couple with the lenses 581 of the IPP 500. One or more of the pads 559 may electrically couple with the photonics chip 554, for example using vias (not shown) through the substrate 556.

Similarly, with respect to active optical plug 450 of FIG. 4, the active optical plug 550 may be used to couple with light entering the IPP 500 vertically, for example either from the top side or, as shown, from the bottom side. IPP 500 may include a photonics die 502 that may be similar to photonics die 102 of FIG. 1, to which the multiple lenses 581 may be optically coupled. The other dies 504, which may be similar to die 104 of FIG. 1, may be electrically coupled with the photonics die 502. As shown, the IPP 500 may be surrounded by an integrated heat spreader (IHS) 503. In embodiments, the active optical plug 550 may be referred to as a "surrogate package" that attaches to a base die, such as PIC 502, throughout the testing process. In embodiments, the active optical plug 550 may be removed either after manufacture, or may be removed by the customer prior to loading the IPP 500 into a socket.

FIG. 5B shows the active optical plug 550 inserted into the IPP 500 for testing to create active optically plugged package 570, which may be similar to active optically plugged package 270 of FIG. 2B. In embodiments, the active optical plug 550 may be secured to the IPP 500 using ferrules (not shown) or by some other securing mechanism.

Figure 6:
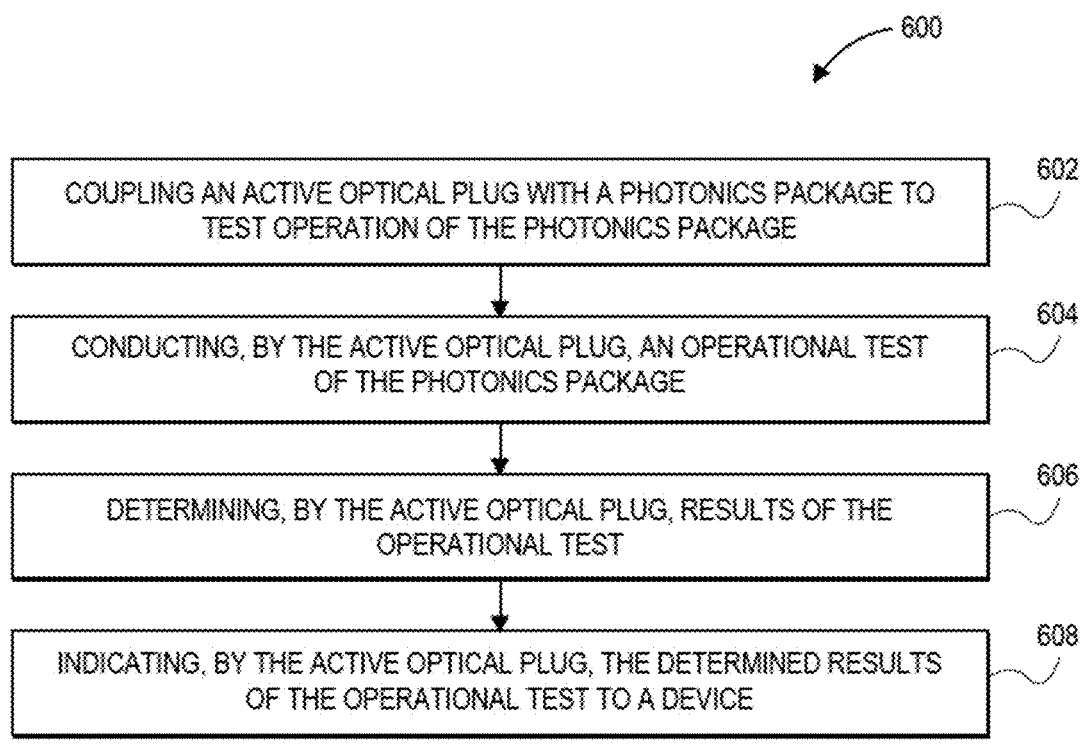
FIG. 6 illustrates an example of a process for testing a photonics package using an active optical plug, in accordance with various embodiments.

FIG. 6 illustrates an example of a process for testing a photonics package using an active optical plug, in accordance with various embodiments. Process 600 may be implemented using the techniques, processes, methods, apparatus, components, and/or systems as described above, and particularly with respect to FIGS. 1-5B. The process may start at block 602.

At block 602, the process may include coupling an active optical plug with a photonics package to test operation of the photonics package. In embodiments, the active optical plug may include the active optical plug 150 of FIG. 1, active optical plug 250 of FIGS. 2A-2B, active optical plug 300 of FIG. 3, active optical plug 450 of FIG. 4, and/or active optical plug 550 of FIGS. 5A-5B.

In embodiments, the photonics package may be IPP 100 of FIG. 1, IPP 200 of FIG. 2A-2B, or IPP 500 of FIG. 5A-5B. In embodiments, the active optical plug may be inserted into a socket, such as optical coupler 112 of FIG. 1 or optical coupler 212 of FIGS. 2A-2B. In other embodiments, the active optical plug may be inserted into a side of a die, for example active optical plug 550 inserted and coupled with IPP 500 as described further with respect to FIG. 5A-5B.

In embodiments, once coupled with an IPP, the active optical plug may be retained in the coupled state by ferrules in the active optical plug and/or the IPP. In embodiments, the coupling of the active optical plug may also serve as a protection to keep optical pathways of the IPP from becoming dusty or damaged, which would result in degraded optical performance.

At block 604, the process may include conducting, by the active optical plug, an operational test of the photonics package. In embodiments, conducting an operational test of the photonics package after coupling the active optical plug may be accomplished in a number of different ways. In embodiments, the active optical plug may begin to transmit and/or receive light signals with the IPP to identify if the PIC is performing within quality guidelines. In embodiments, there may be electrical connections between the active optical plug and the IPP, for example electrical connections 369 of FIG. 3, where both a SOC 104 and a PIC 102 of the IPP 100 of FIG. 1 are operating correctly.

In embodiments, the active optical plug 300 may begin to perform one or more test protocols that are stored on the computer circuitry/memory 357 of the photonics chip 354. In other embodiments, a testing device 370 of FIG. 3 may be electrically coupled with the active optical plug 300 and begin to perform test protocols using the active optical plug 300. In other embodiments, the IPP 100 may initiate testing at various times when it detects that the active optical plug 150 is optically and/or electrically coupled with the IPP 100.

At block 606, the process may include determining, by the active optical plug, results of the operational test. Results of testing the IPP 100 may be identified by the photonics chip 300 during the testing process and stored into the processor circuitry and/or memory 357 of the active optical plug 300 of FIG. 3.

At block 608, the process may include indicating, by the active optical plug, the determined results of the operational test to a device. In embodiments, the active optical plug 300, when a test procedure has been run, may indicate that test results are available by flashing one or more indicator lights 353. Audio-based indicators may also be used. In embodiments, an indication that the test results are available may be sent to the testing device 370 that is electrically coupled with the active optical plug 300 of FIG. 3. In other embodiments, the active optical plug 300 may include a wireless transmitter that may wirelessly transmit an indication of results, or the results themselves, of the test to another device. In embodiments, an indication that the test results are available, or the results themselves, may be transmitted back to the IPP 100.

Figure 7:
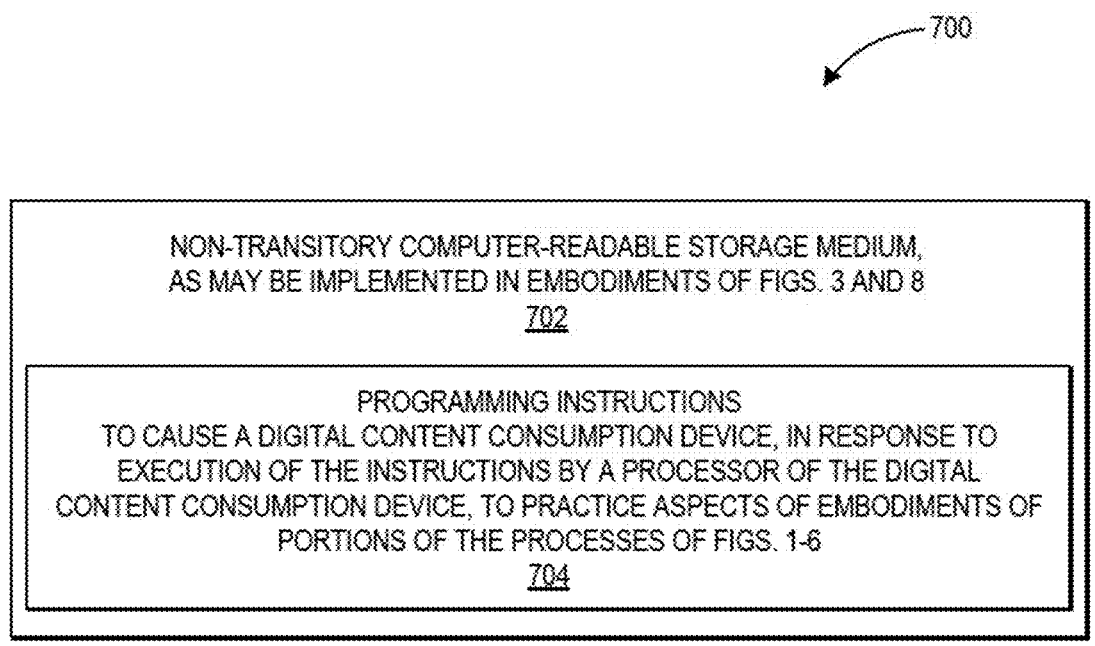
FIG. 7 depicts a computer-readable storage medium that may be used in conjunction with the computing device 900, in accordance with various embodiments.
Figure 8:
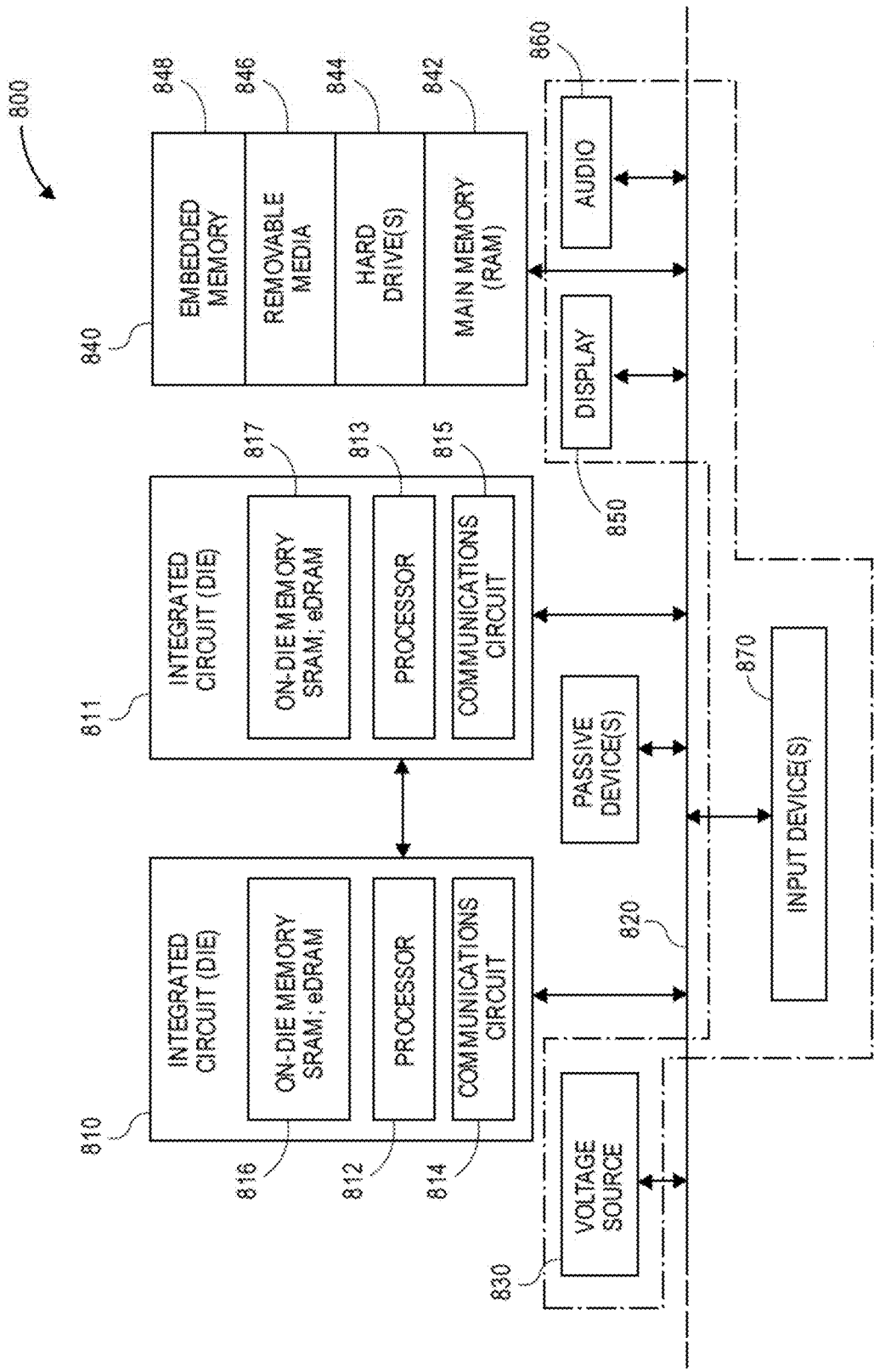
FIG. 8 schematically illustrates a computing device, in accordance with various embodiments.

FIG. 7 depicts a computer-readable storage medium that may be used in conjunction with the computing device, for example processor circuitry and/or memory 357 of FIG. 3, testing device 370 of FIG. 3, or computing device 800 of FIG. 8, in accordance with various embodiments.

Diagram 700 illustrates an example non-transitory computer-readable storage media 702 having instructions configured to practice all or selected ones of the operations associated with the processes described above. As illustrated, non-transitory computer-readable storage medium 702 may include a number of programming instructions related to testing protocols or procedures described with respect to active optical plug 300 of FIG. 3, in particular processor circuitry and/or memory 357 of FIG. 3. Programming instructions 704 may be configured to enable a device, e.g., computing device 800 or processor circuitry and/or memory 357 of FIG. 3, in response to execution of the programming instructions, to perform one or more operations of the processes described in reference to FIGS. 1-6. In alternate embodiments, programming instructions 704 may be disposed on multiple non-transitory computer-readable storage media 702 instead. In still other embodiments, programming instructions 704 may be encoded in transitory computer-readable signals.

FIG. 8 schematically illustrates a computing device, in accordance with various embodiments. The computer system 800 (also referred to as the electronic system 800) as depicted can embody all or part of an active optical plug to optically and/or electrically test a photonics package, according to any of the several disclosed embodiments and their equivalents as set forth in this disclosure. The computer system 800 may be a mobile device such as a netbook computer. The computer system 800 may be a mobile device such as a wireless smart phone. The computer system 800 may be a desktop computer. The computer system 800 may be a hand-held reader. The computer system 800 may be a server system. The computer system 800 may be a supercomputer or high-performance computing system.

In an embodiment, the electronic system 800 is a computer system that includes a system bus 820 to electrically couple the various components of the electronic system 800. The system bus 820 is a single bus or any combination of busses according to various embodiments. The electronic system 800 includes a voltage source 830 that provides power to the integrated circuit 810. In some embodiments, the voltage source 830 supplies current to the integrated circuit 810 through the system bus 820.

The integrated circuit 810 is electrically coupled to the system bus 820 and includes any circuit, or combination of circuits according to an embodiment. In an embodiment, the integrated circuit 810 includes a processor 812 that can be of any type. As used herein, the processor 812 may mean any type of circuit such as, but not limited to, a microprocessor, a microcontroller, a graphics processor, a digital signal processor, or another processor. In an embodiment, the processor 812 includes, or is coupled with, all or part of an active optical plug to optically and/or electrically test a photonics package, as disclosed herein. In an embodiment, SRAM embodiments are found in memory caches of the processor. Other types of circuits that can be included in the integrated circuit 810 are a custom circuit or an application-specific integrated circuit (ASIC), such as a communications circuit 814 for use in wireless devices such as cellular telephones, smart phones, pagers, portable computers, two-way radios, and similar electronic systems, or a communications circuit for servers. In an embodiment, the integrated circuit 810 includes on-die memory 816 such as static random-access memory (SRAM). In an embodiment, the integrated circuit 810 includes embedded on-die memory 816 such as embedded dynamic random-access memory (eDRAM).

In an embodiment, the integrated circuit 810 is complemented with a subsequent integrated circuit 811. Useful embodiments include a dual processor 813 and a dual communications circuit 815 and dual on-die memory 817 such as SRAM. In an embodiment, the dual integrated circuit 810 includes embedded on-die memory 817 such as eDRAM.

In an embodiment, the electronic system 800 also includes an external memory 840 that in turn may include one or more memory elements suitable to the particular application, such as a main memory 842 in the form of RAM, one or more hard drives 844, and/or one or more drives that handle removable media 846, such as diskettes, compact disks (CDs), digital variable disks (DVDs), flash memory drives, and other removable media known in the art. The external memory 840 may also be embedded memory 848 such as the first die in a die stack, according to an embodiment.

In an embodiment, the electronic system 800 also includes a display device 850, an audio output 860. In an embodiment, the electronic system 800 includes an input device such as a controller 870 that may be a keyboard, mouse, trackball, game controller, microphone, voice-recognition device, or any other input device that inputs information into the electronic system 800. In an embodiment, an input device 870 is a camera. In an embodiment, an input device 870 is a digital sound recorder. In an embodiment, an input device 870 is a camera and a digital sound recorder.

As shown herein, the integrated circuit 810 can be implemented in a number of different embodiments, including all or part of an active optical plug to optically and/or electrically test a photonics package, according to any of the several disclosed embodiments and their equivalents, an electronic system, a computer system, one or more methods of fabricating an integrated circuit, and one or more methods of fabricating an electronic assembly that includes a package substrate implementing all or part of an active optical plug to optically and/or electrically test a photonics package, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed processes used for an active optical plug to optically and/or electrically test a photonics package embodiments and their equivalents. A foundation substrate may be included, as represented by the dashed line of FIG. 8. Passive devices may also be included, as is also depicted in FIG. 8.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

The following paragraphs describe examples of various embodiments.

EXAMPLES

Example 1 is an apparatus comprising: a photonics chip to transmit or to receive a light signal; and one or more optical paths optically coupled with the photonics chip, the one or more optical paths to couple with one or more optical paths of a photonics connector of a photonics package to test operation of the photonics package.

Example 2 may include the apparatus of example 1, wherein the one or more optical paths of the apparatus are embedded in a housing; and wherein the housing is to insert into the photonics connector of the photonics package.

Example 3 may include the apparatus of example 1, wherein the one or more optical paths of the apparatus are embedded in a housing; and wherein the housing is to be pressed against the photonics connector of the photonics package.

Example 4 may include the apparatus of example 3, wherein the housing, when inserted into the photonics connector of the photonics package, is to facilitate preventing debris from entering the photonics connector of the photonics package.

Example 5 may include the apparatus of example 1, wherein to test operation of the photonics package further includes to test operation of the photonics package at a selected one of: a time proximate to manufacture of the photonics package, a time during transit of the photonics package to a customer, or a time after the photonics packages delivered to the customer.

Example 6 may include the apparatus of example 1, wherein the photonics chip includes a power source.

Example 7 may include the apparatus of example 6, wherein the power source is a selected one of: a battery, or external electrical connector.

Example 8 may include the apparatus of example 7, wherein external electrical connector is selected one of: a micro-USB port, a USB C port, a I/O pad, or an electrical path embedded in the housing and coupled with the photonics chip, the electrical path to be electrically coupled with the photonics package.

Example 9 may include the apparatus of example 1, wherein the photonics chip is to receive light on one of the one or more optical paths from the photonics package, and to transmit the received light on another of the one or more optical paths to the photonics package.

Example 10 may include the apparatus of example 9, wherein the photonics chip, after receiving the light, is to modify the light before transmitting the modified light on the other of the one or more optical paths.

Example 11 may include the apparatus of example 1, wherein the photonics chip store is a sequence of instructions for testing the operation of the photonics package.

Example 12 may include the apparatus of example 11, wherein the sequence of instructions for testing the operation of the photonics package is stored in a selected one of: a processor coupled with a memory included in the photonics chip, an FPGA included in the photonics chip, or an ASIC included in the photonics chip.

Example 13 may include the apparatus of example 12, wherein the sequence of instructions is placed into the photonics chip via another testing device electrically or optically coupled with the photonics chip.

Example 14 may include the apparatus of example 1, wherein, subsequent to a test of the operation of the photonics package, the apparatus is further to transmit results of the test to a selected one of: a light display coupled with the photonics chip, the photonics package, or another test device electrically or optically coupled with the apparatus.

Example 15 may include the apparatus of any one of examples 1-14, wherein one or more of the optical paths or one or more electrical paths are coupled to a device other than the photonics package.

Example 16 is a method comprising: coupling an active optical plug with a photonics package to test operation of the photonics package; conducting, by the active optical plug, an operational test of the photonics package; determining, by the active optical plug, results of the operational test; and indicating, by the active optical plug, the determined results of the operational test to a device.

Example 17 may include the method of example 16, wherein the device is a selected one of: the photonics package, a visual indicator coupled with the active optical plug, or another device that is electrically or optically coupled with the active optical plug different than the photonics package.

Example 18 is a system, comprising: an active optical plug, comprising: a photonics chip to transmit or to receive a light signal; and one or more optical paths optically coupled with the photonics chip, the one or more optical paths to couple with one or more optical paths of a photonics connector of a photonics package to test operation of the photonics package; a photonics package optically and/or electrically coupled with the active optical plug, the photonics package comprising: a photonics integrated circuit (PIC); a connector optically and/or electrically coupled with the PIC; and wherein the active optical plug is optically and/or electrically coupled with the connector to test operation of the photonics package.

Example 19 may include the system of example 18, wherein the active optical plug is inserted into the connector to facilitate keeping debris away from the optical and/or electrical connector.

Example 20 may include the system of any one of examples 18-19, wherein the photonics chip further includes circuitry to perform multiple tests of the operation of the photonics package.

What is claimed is:

1. An apparatus comprising:
   a first photonics chip to transmit or to receive a light signal;
   one or more optical paths optically coupled with the first photonics chip, the one or more optical paths coupled with one or more optical paths of a photonics connector of a photonics package; and
   an active optical plug coupled to the photonics connector to test operation of the photonics package, the active optical plug comprising a second photonics chip separate and distinct from the first photonics chip.

2. The apparatus of claim 1, wherein the one or more optical paths of the apparatus are embedded in a housing; and
   wherein the housing is to insert into the photonics connector of the photonics package.

3. The apparatus of claim 1, wherein the one or more optical paths of the apparatus are embedded in a housing; and wherein the housing is to be pressed against the photonics connector of the photonics package.

4. The apparatus of claim 3, wherein the housing, when inserted into the photonics connector of the photonics package, is to facilitate preventing debris from entering the photonics connector of the photonics package.

5. The apparatus of claim 1, wherein to test operation of the photonics package further includes to test operation of the photonics package at a selected one of: a time proximate to manufacture of the photonics package, a time during transit of the photonics package to a customer, or a time after the photonics packages delivered to the customer.

6. The apparatus of claim 1, wherein the first photonics chip includes a power source.

7. The apparatus of claim 6, wherein the power source is a selected one of: a battery, or external electrical connector.

8. The apparatus of claim 7, wherein external electrical connector is selected one of: a micro-USB port, a USB C port, a I/O pad, or an electrical path embedded in the housing and coupled with the first photonics chip, the electrical path to be electrically coupled with the photonics package.

9. The apparatus of claim 1, wherein the first photonics chip is to receive light on one of the one or more optical paths from the photonics package, and to transmit the received light on another of the one or more optical paths to the photonics package.

10. The apparatus of claim 9, wherein the first photonics chip, after receiving the light, is to modify the light before transmitting the modified light on the other of the one or more optical paths.

11. The apparatus of claim 1, wherein the first photonics chip store is a sequence of instructions for testing the operation of the photonics package.

12. The apparatus of claim 11, wherein the sequence of instructions for testing the operation of the photonics package is stored in a selected one of: a processor coupled with a memory included in the first photonics chip, an FPGA included in the first photonics chip, or an ASIC included in the first photonics chip.

13. The apparatus of claim 12, wherein the sequence of instructions is placed into the first photonics chip via another testing device electrically or optically coupled with the first photonics chip.

14. The apparatus of claim 1, wherein, subsequent to a test of the operation of the photonics package, the apparatus is further to transmit results of the test to a selected one of: a light display coupled with the first photonics chip, the photonics package, or another test device electrically or optically coupled with the apparatus.

15. The apparatus of claim 1, wherein one or more of the optical paths or one or more electrical paths are coupled to a device other than the photonics package.

16. A method comprising:
    coupling an active optical plug with a photonics package to test operation of the photonics package, the photonics package comprising a first photonics chip, and the active optical plug comprising a second photonics chip separate and distinct from the first photonics chip;
    conducting, by the active optical plug, an operational test of the photonics package;
    determining, by the active optical plug, results of the operational test; and
    indicating, by the active optical plug, the determined results of the operational test to a device.

17. The method of claim 16, wherein the device is a selected one of: the photonics package, a visual indicator coupled with the active optical plug, or another device that is electrically or optically coupled with the active optical plug different than the photonics package.

18. A system, comprising:
    an active optical plug, comprising:
      a first photonics chip to transmit or to receive a light signal; and
      one or more optical paths optically coupled with the first photonics chip, the one or more optical paths to couple with one or more optical paths of a photonics connector of a photonics package to test operation of the photonics package;
    a photonics package optically and/or electrically coupled with the active optical plug, the photonics package comprising:
      a second photonics chip separate and distinct from the first photonics chip;
      a connector optically and/or electrically coupled with the second photonics chip; and
    wherein the active optical plug is optically and/or electrically coupled with the connector to test operation of the photonics package.

19. The system of claim 18, wherein
    the active optical plug is inserted into the connector to facilitate keeping debris away from the optical and/or electrical connector.

20. The system of claim 18, wherein the first photonics chip further includes circuitry to perform multiple tests of the operation of the photonics package.

* * * * *